US006825549B2

(12) United States Patent  
Gründler

(10) Patent No.: US 6,825,549 B2
(45) Date of Patent: Nov. 30, 2004

(54) ELECTRONIC COMPONENT WITH EXTERNAL FLAT CONDUCTORS AND A METHOD FOR PRODUCING THE ELECTRONIC COMPONENT

(75) Inventor: Gerold Gründler, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/233,938

(22) Filed: Sep. 3, 2002

(65) Prior Publication Data

US 2003/0062607 A1 Apr. 3, 2003

(30) Foreign Application Priority Data

Aug. 31, 2001 (DE) .......................................... 101 42 483

(51) Int. Cl.[7] .......................................... H01L 23/495
(52) U.S. Cl. ...................... 257/676; 257/668; 257/666
(58) Field of Search ................................ 257/676, 668, 257/666

(56) References Cited

U.S. PATENT DOCUMENTS 4,543,544 A * 9/1985 Ziegner ........................ 333/34
4,991,001 A 2/1991 Takubo et al.
5,142,351 A 8/1992 Matta
6,476,465 B2 * 11/2002 Hirose ........................ 257/666
2002/0074627 A1 * 6/2002 Combs ........................ 257/666

FOREIGN PATENT DOCUMENTS

| DE | 41 15 421 A1 | 11/1991 |
|---|---|---|
| DE | 41 17 761 A1 | 12/1991 |
| EP | 0 004 148 | 11/1981 |
| JP | 63278359 A | 11/1988 |
| JP | 63-278359 | * 11/1988 |
| JP | 01084625 A | 3/1989 |
| JP | 01084626 A | 3/1989 |
| JP | 64-84626 | * 3/1989 |
| WO | WO 00/03571 | 1/2000 |

* cited by examiner

Primary Examiner—Phat X. Cao
(74) Attorney, Agent, or Firm—Laurence A. Greenberg; Werner H. Stemer; Gregory L. Mayback

(57) ABSTRACT

An electronic component with external flat conductors and a method producing the component includes placing the external flat conductors as waveguides with a defined characteristic impedance on an underside of a dielectric body. The external flat conductors on the underside are surrounded in a coplanar manner by an electrically conductive layer, and a closed, electrically conductive covering layer is disposed on an opposite upper side of the dielectric body.

42 Claims, 4 Drawing Sheets

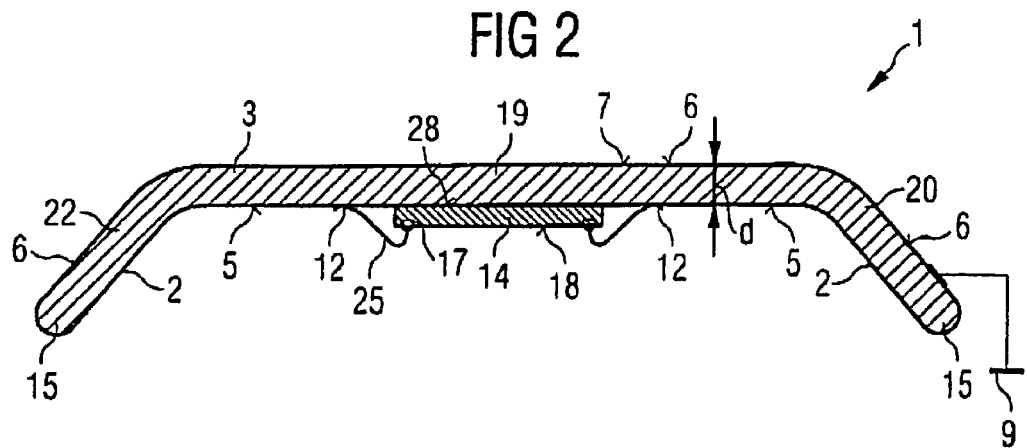
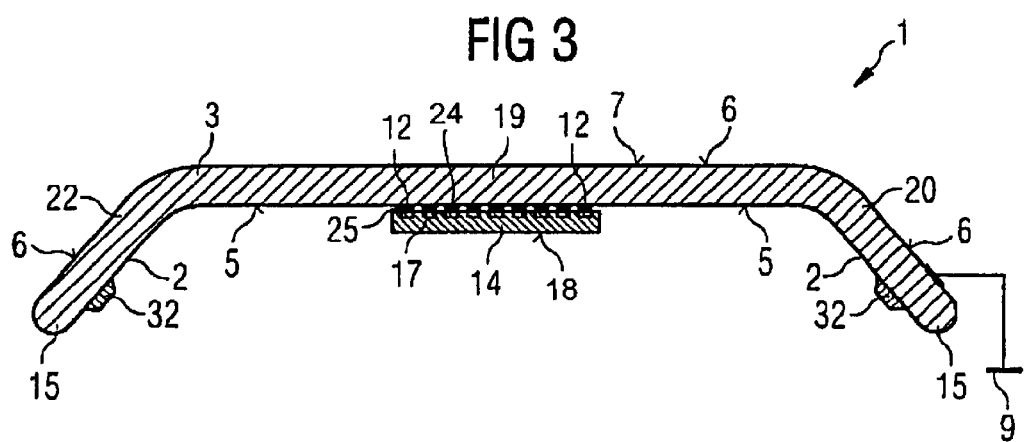

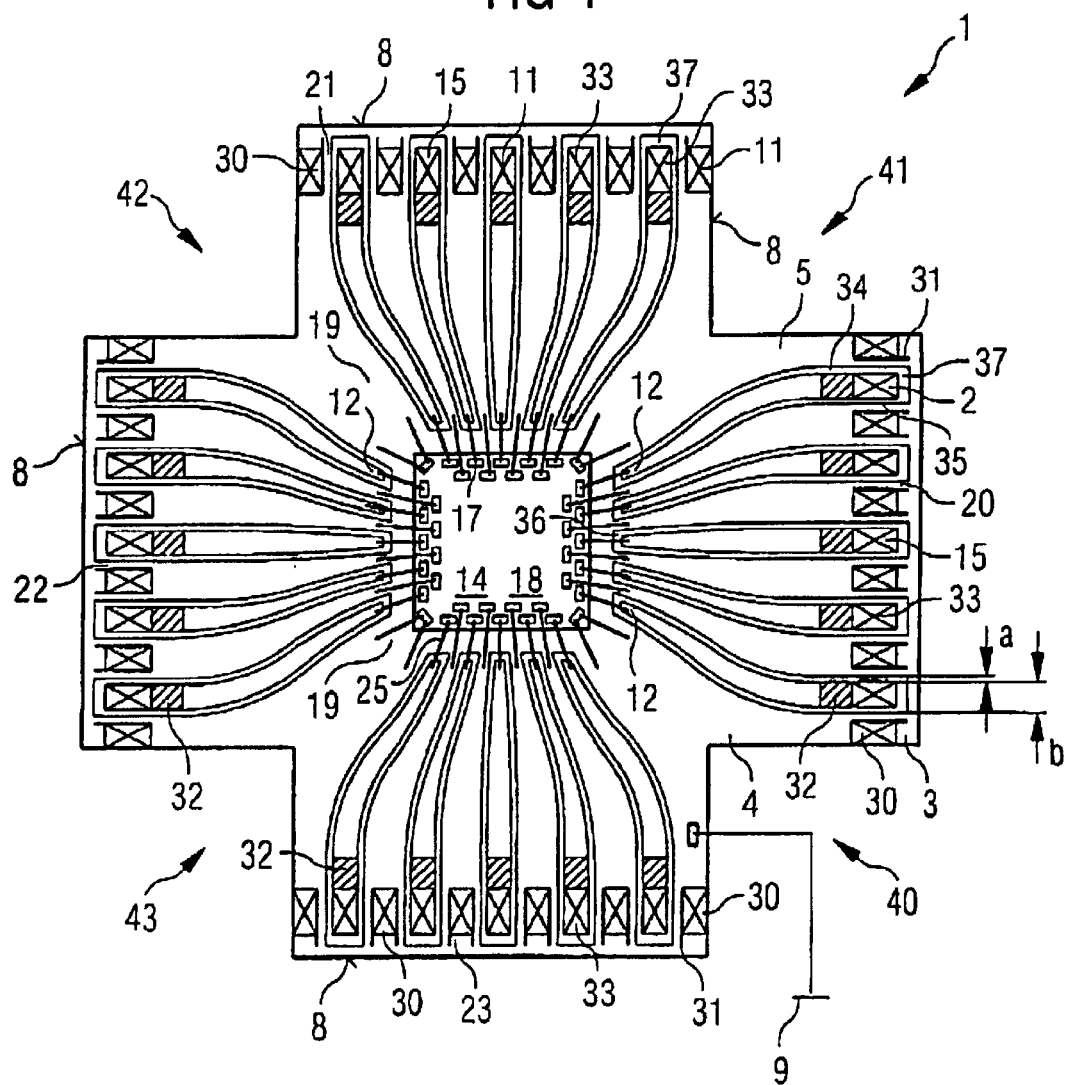

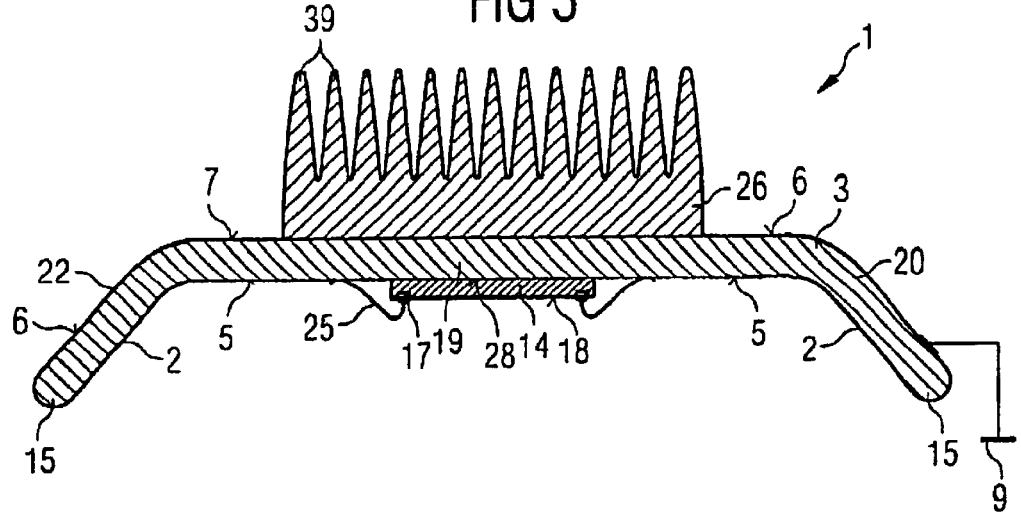
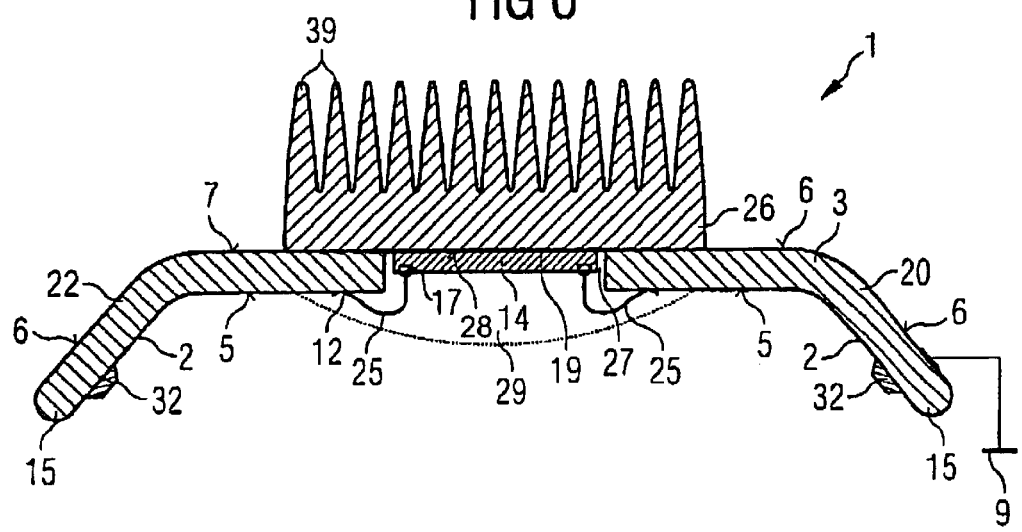

ELECTRONIC COMPONENT WITH EXTERNAL FLAT CONDUCTORS AND A METHOD FOR PRODUCING THE ELECTRONIC COMPONENT

BACKGROUND OF THE INVENTION

FIELD OF THE INVENTION

The invention relates to a component with external flat conductors and a method for producing such a component.

In electronic components with external flat conductors for high-frequency analog and digital electromagnetic signals, the limiting frequencies lie at a few GHz. Although the semiconductor chips and integrated circuits on the semiconductor chip permit substantially higher limiting frequencies, the housings, in particular, the external flat conductors, of conventional electronic components are not capable of transmitting these higher frequencies.

SUMMARY OF THE INVENTION

It is accordingly an object of the invention to provide an electronic component with external flat conductors and a method for producing the electronic component that overcomes the hereinafore-mentioned disadvantages of the heretofore-known devices and methods of this general type and that can transmit high-frequency analog and digital electromagnetic signals of more than one hundred GHz from a semiconductor chip in the interior of the electronic component to contact connecting areas on a printed circuit board or on a multilayer ceramic substrate, and a method for the production of such an electronic component.

With the foregoing and other objects in view, there is provided, in accordance with the invention, an electronic component, including a dielectric body having an upper side and an underside opposite the upper side, a closed, electrically conductive covering layer disposed on the upper side, external flat conductor waveguides having a given characteristic impedance, the waveguides disposed on the underside of the dielectric body, and the conductive layer being coplanar with the waveguides and surrounding the waveguides.

According to the invention, an electronic component with external flat conductors is provided, the external flat conductors being waveguides with defined characteristic impedance. For such a purpose, the external flat conductors are disposed on an underside of a dielectric body and are surrounded in a coplanar manner by an electrically conductive layer on the underside of the dielectric body. On its upper side, the dielectric body has a closed electrically conductive covering layer.

Using such an electronic component with external flat conductors that are so constructed, it is possible to avoid mismatching of the line impedances such as those that occur when processing high-frequency analog or digital electromagnetic signals using conventional components. By constructing the external flat conductors as waveguides with a defined characteristic impedance, signal reflections, which disrupt the transmission, are suppressed. In particular, mismatching at the contact point between the external flat conductor and the line substrate of ceramic or to a printed circuit board is, therefore, minimized. Reflections can be tolerated only as long as the propagation time of the reflected interference signal is smaller than the rise time of the useful signal. Mismatching at the contact point between component housing and system printed circuit board or ceramic printed circuit board, therefore, has a more disruptive effect than mismatching at the contact point between integrated circuit and a component housing. Using the inventive configuration of the external flat conductors as waveguides with a defined characteristic impedance, one of the main sources of mismatching can, therefore, be virtually eliminated so that the inventive electronic component with external flat conductors permits a limiting frequency of more than a hundred GHz.

In accordance with another feature of the invention, the electrically conductive layer on the underside of the dielectric body and the covering layer on the upper side of the dielectric body are connected to each other through electrically conductive edge coatings of the dielectric body. By these layers, the dielectric body is virtually covered by an electrically conductive layer. This electrically conductive layer or electrically conductive covering of the dielectric body can be connected to a reference potential at any desired point on the covering and it is, therefore, possible to achieve the situation in which the reference potential is applied both to the upper side and to the underside of the dielectric body. The characteristic impedance of the external flat conductors can, therefore, be matched exactly in relation to this reference potential.

In accordance with a further feature of the invention, the electrically conductive layer and the covering layer are connected to a common ground potential. A very stable reference potential is, therefore, created for the dimensioning of the external flat conductors as waveguides. The electrically conductive layer on the upper side and on the underside of the dielectric body includes copper or a copper alloy in a further embodiment of the invention. Such metallic layers, as compared with electrically conductive oxidic layers, have the advantage of a lower electrical resistance and a defined alignment of the electromagnetic wave in relation to their surfaces. Copper or copper alloys also have the practical advantage that they adhere well to the dielectric body and, moreover, may be structured in a defined way. Therefore, the underside of the dielectric body can be processed to form exactly structured external flat conductors and an electrically conductive layer surrounding the external flat conductors in a coplanar manner.

In accordance with an added feature of the invention, the electrically conductive layer and the external flat conductors have contact connecting areas on which a solderable coating is disposed. This embodiment of the invention has the advantage that both the external flat conductors and the electrically conductive layer surrounding the external flat conductors can be connected to the ceramic substrate or the system printed circuit board by a soldered connection.

In accordance with an additional feature of the invention, the material thickness of the dielectric body increases gradually from a bonding end of the external flat conductor to a soldering end of the external flat conductor. With the gradual increase in the material thickness of the dielectric body, the characteristic impedance is influenced such that, in spite of the increase in the width of the external flat conductors, it remains constant from the bonding end to the soldering end, and, therefore, reflections are suppressed. High-frequency analog and digital electromagnetic signals can, therefore, be transmitted with controlled impedance.

In accordance with yet another feature of the invention, the width of the external flat conductor increases gradually from the bonding end to the soldering end. Such a configuration is used, firstly, for impedance matching, secondly, also for geometric matching of the external flat conductors in the area of the bonding point to the microscopically small grid dimension of the contact areas on the semiconductor chip and, in the area of the soldering point, to the macroscopic grid dimension of the contact connecting areas of the ceramic substrate or the system printed circuit board. In such a connection, microscopically small is understood to mean an order of magnitude that can be measured only under an optical microscope, and macroscopically large is understood to mean an order of magnitude that can be seen and measured with the naked eye.

In accordance with yet a further feature of the invention, the spacing between the external flat conductors and the surrounding electrically conductive layer increases gradually from the bonding end to the soldering end of each external flat conductor, in the form of a widening slot. With such an increase, it is possible to take care that, in spite of the widening external flat conductor, the characteristic impedance remains constant over the length of the external flat conductor. Thus, substantially three measures influence the possible matching of the characteristic impedance to the length of the external flat conductor, namely, first, the width of the external flat conductor itself, the width of the spacing in the form of a widening slot between the external flat conductor and the surrounding electrically conductive layer and, finally, the thickness of the dielectric body in the area of the external flat conductor and, therefore, the spacing between the external flat conductor and the covering layer. By appropriate simulation calculations, by varying these three influencing variables, the characteristic impedance or the impedance of the external flat conductors can be predetermined and adjusted. While the thickness variation, once set, of the dielectric body can no longer be varied in the further production processes housing, the increase in the spacing between the external flat conductors and the surrounding dielectric layer, and also the increase in the width of the external flat conductor, can be influenced up to the conclusion of the production of the electronic component.

In accordance with yet an added feature of the invention, the dielectric body has a central area and an edge area, the edge area being bent over with respect to the central area. As a result of the bending of the edge area, the electronic component is given the form of an inverted plate in its external flat conductor area. However, the edge area is not a closed plate edge but an edge segmented into a plurality of edge areas so that the bent edge areas can react flexibly to thermal expansion differences without loading the ceramic substrate or the system printed circuit board and without transmitting the thermal stresses to the semiconductor chip. The edge, bent over and segmented into edge areas, permits resilient and flexible matching of the electronic component to the system printed circuit board or to the ceramic substrate.

In accordance with yet an additional feature of the invention, the central area is rectangular or square, a bent edge area extending in a projecting manner from each rectangular side or square side. A substantial proportion of the external flat conductor extent lies in the edge area so that the external flat conductors can react flexibly to thermal expansion differences between the electronic component and the system printed circuit board or the ceramic substrate without endangering the semiconductor chip of the electronic component.

In accordance with again a further feature of the invention, the central area is adapted to support a semiconductor chip.

In accordance with again another feature of the invention, the semiconductor chip is disposed in the central area, while the external flat conductors extend in a star shape from the central area to the edge areas. Such a configuration advantageously achieves the situation in which the semiconductor chip is at a great distance from the soldering points on the system printed circuit board or the ceramic substrate and is, therefore, mechanically decoupled from the latter.

In accordance with again an added feature of the invention, the semiconductor chip is disposed with its contact areas and contact beads disposed thereon on the bonding points of the external flat conductors in a flip-chip technique. For such a purpose, the external flat conductors are disposed with their bonding points overlapping in relation to an area of the surface of the semiconductor chip and are structured such that each bonding end of an external flat conductor lies opposite a contact bead of the semiconductor chip. Such a configuration has the advantage that the semiconductor chip is directly electrically connected to the external flat conductors through its contact beads without any bonding wires.

In accordance with again an additional feature of the invention, the semiconductor chip is connected, by its contact areas, through bonding connections to the bonding points of the external flat conductors. In such a case, these bonding connections are produced between the semiconductor chip and the bonding points of the external flat conductors in an additional step. For such a purpose, bonding wires from the contact areas of the semiconductor chip are bonded to the bonding points of the external flat conductors. This electronic component has the advantage that its semiconductor chip can be produced substantially more economically than a semiconductor chip that is provided for flip-chip technology.

In accordance with still another feature of the invention, the covering layer has a heat sink in the central area. The heat sink on the covering layer has the advantage that it can be fitted at any time and, because of the metallization of the covering layer, permits good heat transfer to the dielectric body and to the central area. The heat sink can be provided with cooling ribs to increase its cooling action in moving air. However, the heat sink can also be provided with cooling ducts, through which a cooling medium is guided. By the heat sink, the covering layer is cooled intensively, and, therefore, so is the semiconductor chip, which is disposed opposite in the central area. In such an embodiment, the material of the dielectric body is located between the semiconductor chip and the heat sink.

In accordance with still a further feature of the invention, the dielectric body has an opening in the central area, the opening being bridged by a heat sink on the upper side of the dielectric body. The semiconductor is disposed in the opening with its rear side on the heat sink. Bonding connections are disposed from the contact areas on the upper side of the semiconductor chip to the bonding ends of the external flat conductors on the underside of the dielectric body. The bonding connections and the semiconductor chip are embedded in a plastic compound in this embodiment of the invention. Both the semiconductor chip and the bonding connections are, therefore, protected against damage and, on the other hand, as a result of the direct placement of the semiconductor chip on the heat sink, it is ensured that the heat transfer between semiconductor chip and heat sink is maximized so that optimum dissipation of heat is made possible with this embodiment.

Both the soldering ends of the external flat conductors and the electrically conductive layers of the dielectric body are connected electrically, through contact connecting areas on the soldering ends of the external flat conductors, to corresponding connections on the system printed circuit board or the ceramic substrate, which, in one embodiment of the invention, is carried out by soldering the contact connecting areas to the connections. During soldering, it is ensured that the molten solder does not short-circuit the external flat conductors to the electrically conductive layer.

In accordance with still an added feature of the invention, there are provided ground contact connecting areas of the electrically conductive layer on the underside of the dielectric body are bounded by slots, disposed at the side of each contact connecting area, in the electrically conductive layer. Such a configuration ensures that all the contact connecting areas to be soldered are of equal size and that the solder cannot penetrate as far as the slots bounding the external flat conductors in the external flat conductor structure. The molten solder is, instead, prevented from flowing further at the slots disposed at the side, and, therefore, limited to a defined soldering area.

On the external flat conductors, solder stop areas can limit the outward flow of the molten solder along the external flat conductors. In such a case, the solder contact connecting areas are disposed on the bent-over side edges of the dielectric body, and the solder stop resist areas adjoin these solder contact connecting areas.

In accordance with still an additional feature of the invention, the material provided for the dielectric body is a liquid crystal polymer material. The liquid crystal polymer material is distinguished by the fact that it exhibits beneficial dielectric properties and its composition can be varied to match the characteristic impedance of the outer flat conductors.

In accordance with another feature of the invention, the dielectric body is an injection-molded body. Such a configuration has the advantage that the bent-over edge areas can already be taken into account in the injection mold, and, therefore, the entire dielectric body can be produced in its final form in one operation, likewise with any possibly required thickness variations in the area of the external flat conductors.

With the objects of the invention in view, there is also provided a method of producing an electronic component, including the steps of injection molding a dielectric body having sides, an underside, an upper side, a rectangular central area, and bent edge areas on the sides, the edge areas having side edges, applying an electrically conductive layer to the underside, the upper side, and the side edges of the dielectric body, structuring the conductive layer on the underside of the dielectric body into external flat conductors extending from the central area to the edge areas and surrounded by the conductive layer, applying a semiconductor chip in the central area of the dielectric body and connecting contact areas of the semiconductor chip to bonding ends of the external flat conductors, and filling the central area with a plastic compound.

A process for producing an electronic component with external flat conductors has the following process steps. First of all, a dielectric body having an underside and an upper side and a rectangular central area with bent-over edge areas on the sides of the central area is injection molded. The dielectric body is then covered by applying an electrically conductive layer to the underside, to the upper side, and to the edges of the edge areas of the dielectric body. Finally, the electrically conductive layer on the underside of the dielectric body is structured to form external flat conductors and surrounding dielectric layer. In such a case, the external flat conductors extend from the central area to the edge areas. By the structuring, the edge areas are surrounded by the electrically conductive layer. After that, a semiconductor chip is applied to the underside of the dielectric body, in the central area, and the contact areas of the semiconductor chip are connected to bonding ends of the external flat conductors. Finally, to protect the semiconductor chip and to protect bonding connections, the central area is filled with a plastic compound.

Such a process has the advantage that, during the structuring of the electrically conductive layer on the underside of the dielectric body to form external flat conductors, the latter can be configured as waveguides that have a constant characteristic impedance. As a result of surrounding the external flat conductor with a dielectric body and a closed, electrically conductive layer both on the upper side of the dielectric body and on the underside of the dielectric body, each external flat conductor is formed into an impedance-matched waveguide. Therefore, mismatching and reflections during the transmission of high-frequency analog and digital signals to the external flat conductor are reduced. At the same time, the configuration is associated with the advantage that electronic components for high-frequency digital and analog signals have a limiting frequency that is higher by at least one order of magnitude than conventional semiconductor packages. Furthermore, the process has the advantage that it provides relatively inexpensive process steps, such as coating the dielectric body on all sides with an electrically conductive layer and using the layer on the underside to implement the external flat conductors, and also the use of the layer on the underside to represent and implement a chip island in the central area, which can accommodate the semiconductor chip.

In accordance with a further mode of the invention, the structuring of the electrically conductive layer on the underside of the dielectric body into external flat conductors is carried out following previous simulation calculation of the waveguiding function of the external flat conductors while matching their impedance to standardized characteristic impedances. Because of the configuration according to the invention of the electronic component, simplified simulation calculations can be carried out within the context of the optimization method to implement a constant characteristic impedance for the external flat conductors. In such a case, the material characteristics of the dielectric body are included in the simulation, as are the increase in width of the external flat conductors from their bonding ends to their soldering ends and the spacing of the external flat conductors or the slit width between the external flat conductor and the surrounding, electrically conductive layer on the underside of the dielectric body. Finally, the characteristic impedance can be influenced by an increase in the thickness of the dielectric body to the length of the external flat conductors.

In accordance with an added mode of the invention, the structuring of the electrically conductive layer on the underside of the dielectric body into external flat conductors is carried out by etching through an etching mask. Etching through an etching mask is already not a problem because the dielectric body is curved. The actual problem is represented here by the production of the etching mask on the three-dimensional body. To solve such a problem, first of all, a masking layer of tin or a tin alloy is applied to the dielectric body. By a suitably matched laser, laser ablation is carried out in the masking layer of tin or a tin alloy, the three-dimensional form of the underside to be structured on the dielectric body not substantially impairing the accuracy of the laser ablation. Following the structuring of the masking layer by laser ablation, the electrically conductive layer, which substantially includes copper or a copper alloy, is exposed to the introduction of the structure of the external flat conductors.

During wet etching of the copper or copper alloy layer, the structured tin layer serves as a mask. This tin mask is removed from the underside of the dielectric body after the etching of the electrically conductive layer.

A bondable coating can, then, be applied to the bonding ends of the external flat conductors so produced. Such a configuration has the advantage that the subsequent bonding steps can be carried out reliably. At the same time, beforehand or else afterward, a coating of a solderable compound can be applied to the appropriate contact connecting areas on the soldering ends of the external flat conductors.

The compound serves, on one hand, to define the soldering areas exactly and, on the other hand, to improve the reliability of the soldered connections.

Following the coating of the bonding ends and the soldering ends of the external flat conductors, a semiconductor chip using flip-chip technology can be applied to the underside of the dielectric body, in the central area, with its contact beads on the bonding ends of the external flat conductors. The configuration has the advantage that no wire bonding connectors have to be produced, instead soldering of the contact beads of the semiconductor chip directly to the bonding ends of the external flat conductors can be carried out. At the same time, the reliability of such mounting is increased and, therefore, the reliability of the connection between the semiconductor chip and the external flat conductors as waveguides with a constant characteristic impedance is increased.

In accordance with an additional mode of the invention, a semiconductor chip can also be applied by the rear side of the semiconductor chip being applied to the central area of the dielectric body. Then, on the underside, a connection between the contact areas on the semiconductor chip and the bonding ends of the external flat conductors is produced through bonding wires. In such a case, an additional step for protecting the bonding connections is carried out, in which the bonding connections are embedded in a plastic compound.

In accordance with yet another mode of the invention, a chip is provided, as the semiconductor chip, with an upper side having contact areas thereon.

In accordance with yet a further mode of the invention, the bonding connections are produced between the contact areas of the chip and the bonding ends of the external flat conductors after the application of the chip.

In accordance with a concomitant mode of the invention, an opening in the central area of the dielectric body is already created during the injection molding of the dielectric body. Following the application of the electrically conductive layers and the structuring of the layer on the underside of the dielectric body, the opening is covered by a heat sink on the upper side of the dielectric body. The semiconductor chip can, then, be disposed directly in the central opening in the dielectric body, with its rear side on the heat sink. Such a configuration can be carried out by soldering on or adhesively bonding to the heat sink. The process has the advantage that a most effective possible way of cooling the electronic component for high-frequency analog and digital signals is achieved in a simple manner.

In summary, it is to be recorded that, with the present invention, an electronic component with external flat conductors is provided that is able to transmit high-frequency analog and digital electromagnetic signals in an impedance-controlled manner. Mismatching of the line impedances is, therefore, avoided, and associated disruptive signal reflections are suppressed. The limiting frequency of electronic components for high-frequency analog and digital electromagnetic signals can be improved by at least one order of magnitude with the electronic component according to the invention.

In addition, the bent-over form of the external flat conductors ensures that, under an alternating thermal load, adequate elasticity of the connection between the electronic component and the system printed circuit board or ceramic substrate is ensured. Thus, in the event of an alternating thermal load, the connection will guarantee adequate elasticity between package and system printed circuit board. In addition, the sensitive components within the electronic component are protected against thermally induced stresses and mechanical damage as a result, particularly because, as a result of the bent-over edge areas of the dielectric body, the latter curves over these sensitive components, such as bonding connections and semiconductor chip.

Finally, the electronic component according to the invention provides the further advantage that, even with the minimum connecting grid of the external flat conductors of less than 0.5 mm, the bent-over edge areas of the dielectric body provide mechanically stable support, which permits very fine connecting grids without mechanical damage being able to occur during test handling or during board assembly. Further advantages of the invention reside in the fact that, for example, the same coated dielectric body can be used for different products, merely by changing the structuring of the electrically conductive surfaces with a laser. Furthermore, a change can be made without difficulties from the flip-chip technique to the bonding technique and vice-versa, and, therefore, the electronic component can be made available for both types of connection and both types of semiconductor chip.

Furthermore, the housing is suitable to accommodate a plurality of active and passive components in the central area, and, therefore, to implement a multi-chip package. In addition, by disposing a heat sink on the upper side of the dielectric body, the thermal performance of the electronic component is improved. Furthermore, there is the possibility of disposing through-contacts through the dielectric body so that the electrical characteristics can be improved further and the effectiveness of the heat sink can be increased.

In addition, the quality between package and system board or system printed circuit board can be improved further by applying a solder stop resist strip with a dispenser, the soldering point quality being improved by slots in the metallization because all the soldering points can, therefore, be configured to be of the same size, which signifies a considerable simplification for the soldering process. In addition, a plurality of packages can be produced one-dimensionally in a strip configuration or two-dimensionally in a matrix configuration. The dielectric bodies of the individual packages are in such a case joined to one another by webs so that the entire strip or the entire matrix can be produced in a single injection molding operation. The webs are, then, configured as intended fracture points weaker than the dielectric body of the individual packages so that the individual packages can be separated from one another again. In the material composite, the production of the packages is possible in a more cost-effective way because they can subsequently be separated again by breaking, sawing, cutting, or punching.

Other features that are considered as characteristic for the invention are set forth in the appended claims.

Although the invention is illustrated and described herein as embodied in an electronic component with external flat conductors and a process for producing the electronic component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a diagrammatic, cross-sectional view of the electronic component of FIG. 1 along section line A—A;

FIG. 3 is a diagrammatic, cross-sectional view of a second embodiment of the electronic component of FIG. 1;

FIG. 4 is a diagrammatic plan view from below of a third embodiment of the electronic component of FIG. 1;

FIG. 5 is a diagrammatic, cross-sectional view of a fourth embodiment of the electronic component of FIG. 1; and FIG. 6 is a diagrammatic, cross-sectional view of a fifth embodiment of the electronic component of FIG. 1.

DESCRIPTION OF THE PREFERRED EMBODIMENTS

Figure 1:
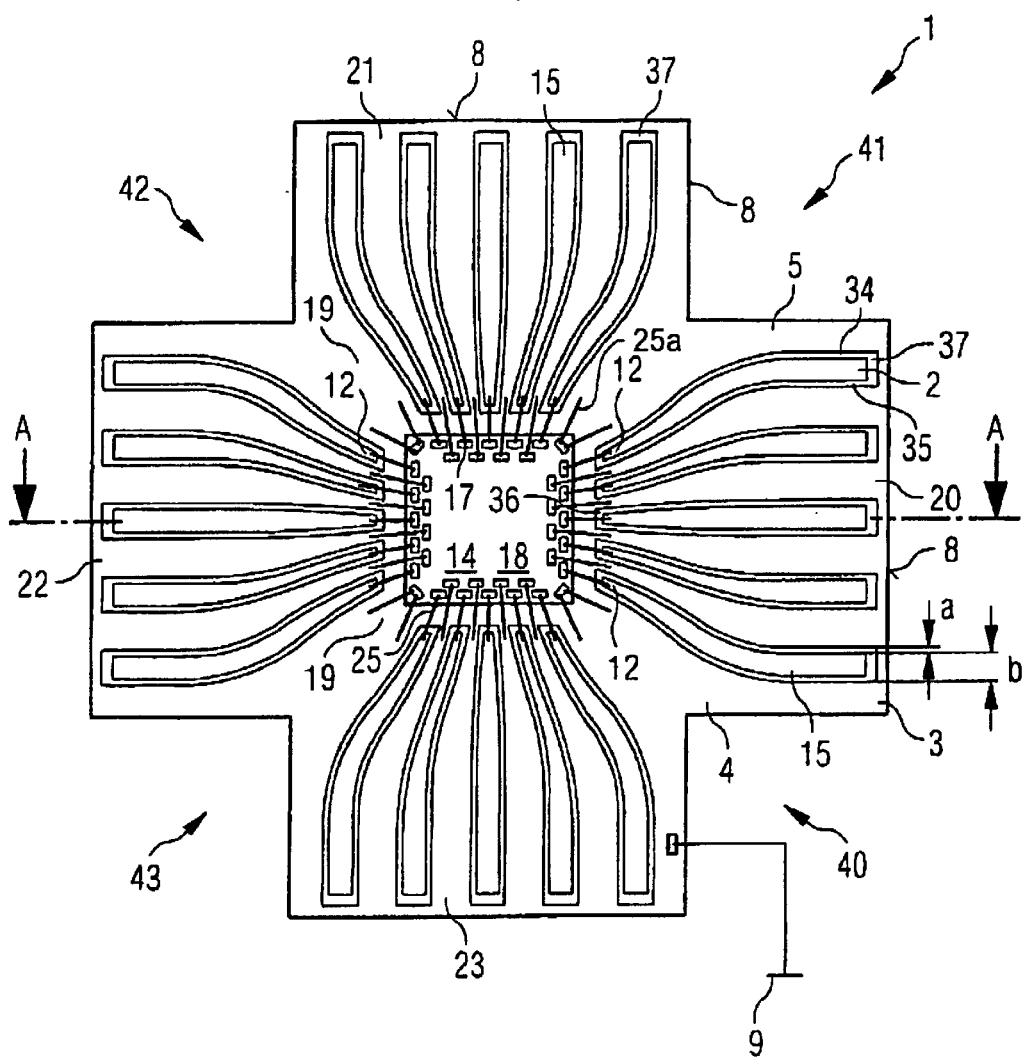
FIG. 1 is a diagrammatic plan view from below of an electronic component according to the invention.

Referring now to the figures of the drawings in detail and first, particularly to FIG. 1 thereof, there is shown a schematic view from below of an electronic component 1 of a first embodiment of the invention, including external flat conductors 2, a dielectric body 3 that is covered on its underside 5 with a structured electrically conductive layer 4, edge coatings 8 that surround the dielectric body 3 and form a non-illustrated electrically conductive connection to the covering layer on the upper side of the dielectric body 3, a ground potential 9 connected to the electrically conductive layer 4 on the underside 5 of the dielectric body 3, a bonding end 12 of an external flat conductor 2, a soldering end 15 of the external flat conductor 2, a semiconductor chip 14 disposed in a central area 19 on the underside 5 of the dielectric body 3, and contact areas 17 on the active upper side 18 of the semiconductor chip 14. The areas 17 are connected to the bonding ends 12 of the external flat conductors 2 through bonding connections 25. Furthermore, the exemplary embodiment of FIG. 1 shows additional bonding connections 25a that lead from contact areas 17 on the upper side 18 of the semiconductor chip 14 to the electrically conductive layer 4 on the underside of the dielectric body 3.

The external flat conductors 2 are incorporated into the electrically conductive layer 4 on the underside 5 of the dielectric body 3. Through four slots 34, 35, 36, 37, the slots 34 and 35 being disposed in a longitudinal direction of the external flat conductors and the slots 36 and 37 being provided at the two ends of the external flat conductors, each external flat conductor 2 is separated from the surrounding electrically conductive layer 5. The external flat conductors 2 are narrower at the bonding ends 12 than at the soldering ends 15. The width of the external flat conductors 2 in the area of the bonding ends 12 is matched to the fine grid dimension of the contact connecting areas 17 of the semiconductor chip 14.

The width of the external flat conductors 2 in the area of the soldering ends 15 is matched to the grid dimension of the system printed circuit board or the ceramic substrate on which the component is to be mounted. The width of the external flat conductor 2, consequently, increases gradually from the bonding end 12 to the soldering end 15. In order, nevertheless, to implement the external flat conductor as a waveguide with a constant characteristic impedance, the spacing slots 34 and 35 in the longitudinal direction of the external flat conductors 2 can be varied in their widths. In this embodiment of the invention, the spacing slots 34 and 35 in the bonding area or in the area of the bonding ends 12 are narrower than in the soldering area of the soldering ends 15. Furthermore, to match the characteristic impedance of the external flat conductor 2, the thickness of the dielectric body 3 can be varied. For example, the material thickness of the dielectric body 3 can increase gradually from the bonding ends 12 of the external flat conductors 2 toward the soldering ends 15 of the external flat conductors 2 to achieve a constant characteristic impedance for the length of the external flat conductor 2.

The electronic component 1 of the first embodiment has a central area 19, which has the semiconductor chip 14 and the bonding connections 25 and accommodates the bonding ends 12 of the external flat conductors 2. Disposed on each side of the rectangular or square central area 19 are edge areas 20, 21, 22, 23, which extend outward from the side edges of the central area 19. These edge areas 20, 21, 22, 23 substantially carry the external flat conductors 2 that, both in the central area 19 and in the edge areas 20, 21, 22, 23, are surrounded in a coplanar manner by the electrically conductive layer 4. In this embodiment of the invention, the layer 5 includes copper or a copper alloy. The layer thickness is only a few micrometers. The dielectric body 3 is substantially composed of a liquid crystal polymer. The edge regions 20, 21, 22, 23 are bent with respect to the plane of the drawing, so that the central area 19 is deeper than the edge areas 20, 21, 22, 23. As a result of cutouts 40, 41, 42, 43 between the edge areas 20, 21, 22, 23, the soldering ends 15 of the external flat conductors 2 become very flexible so that thermal expansion differences between the system printed circuit board and the electronic component 1 can be compensated for without damaging the soldering areas or the semiconductor chip.

FIG. 2 shows a schematic cross-sectional view along the section line A—A in FIG. 1 of the electronic component 1 of the first embodiment of the invention. Components with the same functions as in FIG. 1 are identified by the same designations and are not specifically explained.

The electronic component 1 with external flat conductors 2 of the first embodiment of the invention has a dielectric body 3 that, on the underside 5, carries the external flat conductors 2, which are formed as waveguides with a defined characteristic impedance. Because of the defined characteristic impedance, high-frequency digital and analog signals are transmitted from the semiconductor chip 14 through the contact areas 17 and the bonding connections 25, and the bonding ends 12, to the soldering ends 15 of the external flat conductor 2. In such a case, the impedance matching or the setting of a defined characteristic impedance for the external flat conductor 2 can also be carried out by varying the material thickness d of the dielectric body 3. Furthermore, the matching and setting of a defined characteristic impedance can be carried out by varying the width b of the external flat conductor 2 and, finally, the matching or setting of a defined characteristic impedance can be performed specifically by setting the spacing-slot widths a of the slots 34 and 35, as shown in FIG. 1. When the spacing-slot width a is set, the coplanar waveguide component is balanced, while setting the thickness d of the dielectric body balances the strip waveguide component. The present invention, thus, permits a combination of a coplanar waveguide and a strip waveguide, with optimum matching possibilities for a defined characteristic impedance being provided.

FIG. 3 shows a schematic cross-sectional view of an electronic component 1 of a second embodiment of the invention. Components with the same functions as in the preceding figures are identified by the same designations and are not specifically explained.

The difference between the second embodiment according to FIG. 3 as compared with the first embodiment, as shown in FIGS. 1 and 2, lies in the configuration of the bonding connections as a result of direct contacts between external contacts of the semiconductor chip 14 and bonding ends of the external flat conductors 2. For such a purpose, the bonding ends 12 of the external flat conductors 2 extend in an overlapping manner as far as into the area of the semiconductor chip 14 so that the external contacts, in the form of contact beads 24 of the semiconductor chip 14, can be connected directly to bonding ends 12 of the external flat conductors 2. This type of bonding connection is carried out with semiconductor chips in the flip-chip technique. The embodiment of the invention has the advantage that the bonding connections are protected and easily damaged bonding wires are not used. A further difference of the embodiment, as compared with the embodiment according to FIGS. 1 or 2, is that solder stop areas 32 are disposed at the soldering ends 15. The solder stop areas 32 prevent molten solder from being able to creep along the external flat conductor 2.

FIG. 4 shows a schematic view from below of an electronic component 1 according to a third embodiment of the invention. Components with the same functions as in the preceding figures are identified with the same designations and are not specifically explained.

In FIG. 4, solder content connecting areas 33 are identified by a cross and are located both on the external flat conductors 2 and between the external flat conductors 2 on the electrically conductive layer 4. To implement a uniform width of the solder contact connecting areas 33 on the external flat conductors 2 and on the electrically conductive layer 4, additional side slots 31 bound the solder contact connecting areas 33 on the electrically conductive layer 4. At the same time, these side slots 31 ensure that no molten material flows from the electrically conductive layer 4 to the soldering ends 15 of the external flat conductors 2. In addition to the solder coating on the solder content connecting areas 33, the external flat conductors 2 have an area, identified with hatching, corresponding to a solder stop resist coating 32. With the aid of the solder stop resist coating 32 on the external flat conductors 2, molten solder is prevented from creeping along the solder contact connecting areas 33 of the external flat conductors 2 to the bonding end 15.

FIG. 5 shows a schematic cross-sectional view of an electronic component 1 according to a fourth embodiment of the invention. Components with the same functions as in the preceding figures are identified by the same designations and are not specifically explained.

The fourth embodiment of the invention differs from the preceding embodiments of the invention in that the embodiment has a heat sink 26 on the upper side 7 of the dielectric body 3. The heat sink 26 is disposed in the central area 19 of the dielectric body 3. On an opposite side from the heat sink 26, the semiconductor chip 14 is disposed with its rear side 28 on the underside 5 of the dielectric body 3. The rear side 28 of the semiconductor chip 14 is, thus, cooled intensively by the heat sink 26. However, the material of the dielectric body 3 with a restricted thermal conductivity is located between the heat sink 26 and the semiconductor chip 14.

FIG. 6 shows a schematic cross-sectional view of an electronic component 1 according to a fifth embodiment of the invention. Components with the same functions as in the preceding figures are identified by the same designations and are not specifically explained.

The fifth embodiment of the invention differs from the fourth embodiment of the invention in that an opening 27 is provided in the central area 19 of the dielectric body 3. A heat sink 26 having cooling ribs 39 for more intensive cooling covers the opening 27. In the opening 27, the semiconductor chip 14 is disposed with its rear side 28 directly on the heat sink 26. Such a configuration ensures intensive cooling of the semiconductor chip 14. In addition, the fifth embodiment has the advantage that the bonding wires 25 that connect the contact areas 17 on the active upper side of the semiconductor chip 14 to the bonding ends 12 of the external flat conductors 2 can be configured to be shorter, and, therefore, injection of noise signals is reduced. The bonding connections 25 and the semiconductor chip 14 are embedded in a plastic compound 29 after the production of the bonding connections 25 so that the opening 27 is continuously closed. Such a plastic compound 29 can also be provided to protect the bonding connections 25 and the semiconductor chip 14 in the preceding embodiments. In the fifth embodiment according to FIG. 6, solder stop resist areas 32 are provided in the area of the soldering ends 15 to prevent molten solder from creeping along the external flat conductors 2.

I claim:

1. An electronic component, comprising:
    a dielectric body having:
        a central area;
        edge areas bent with respect to said central area;
        an upper side with closed, electrically conductive covering layer; and
        an underside disposed opposite said upper side;
    external flat conductor waveguides having a given characteristic impedance;
    a conductive layer;
    said conductive layer and said waveguides disposed on said underside of said dielectric body; and
    said conductive layer being coplanar with said waveguides and surrounding said waveguides.

2. The electronic component according to claim 1, wherein:
    said dielectric body has electrically conductive edge coatings; and
    said conductive layer connected to said covering layer through said edge coatings.

3. The electronic component according to claim 1, wherein said conductive layer and said covering layer are connected to a common ground potential.

4. The electronic component according to claim 1, wherein said conductive layer is of one of the group consisting of copper and a copper alloy.

5. The electronic component according to claim 4, wherein:

said conductive layer and said waveguides have contact connecting areas; and a solderable coating is disposed on said contact connecting areas.

6. The electronic component according to claim 1, wherein:
each of said waveguides has a soldering end and a bonding end; and
said dielectric body has a material thickness gradually increasing from said boding end of each of said waveguides to said soldering end of each of said waveguides.

7. The electronic component according to claim 1, wherein:
each of said waveguides has a width, a soldering end, and a bonding end;
said width of each of said waveguides gradually increases from said bonding end to said soldering end;
a semiconductor chip has an active upper side with a contact area grid of contact areas thereon;
a ceramic substrate has a contact connecting area grid of contact connecting area;
a system printed circuit board has a contact connecting area grid of contact connecting areas; and
said waveguides and said width correspond to the area grid of one of said semiconductor chip, said ceramic substrate, and said system printed circuit board.

8. The electronic component according to claim 1, wherein
each of said waveguides has a soldering end and a bonding end; and
a spacing between said waveguides and said conductive layer increases gradually from said bonding end to said soldering end of said waveguides.

9. The electronic component according to claim 1, wherein:
said central area is rectangular with sides;
each of said bent edge areas project from each of said sides of said central area.

10. The electronic component according to claim 1, including a semiconductor chip disposed at said central area.

11. The electronic component according to claim 1, wherein said central area is adapted to support a semiconductor chip.

12. The electronic component according to claim 7, wherein:
said semiconductor chip has contact beads; and
at least one of said contact areas and said contact beads are disposed on bonding ends of said waveguides in a flip-chip technique.

13. The electronic component according to claim 7, wherein said contact area of said semiconductor chip are connected through bonding connections to said bonding ends of said waveguides.

14. The electronic component according to claim 1, wherein:
said covering layer has a central area; and
a heat sink is disposed in said central area.

15. The electronic component according to claim 13, wherein
said dielectric body has:
a central area; and
an opening in said central area;
a heat sink bridges said opening on said upper side of said dielectric body;

said semiconductor chip has a rear side and is disposed in said opening with said rear side on said heat sink;
bonding connections are disposed from said contact areas on said upper side of said semiconductor chip to said bonding ends of said waveguide; and
said semiconductor chip and said bonding connections are embedded in a plastic compound.

16. The electronic component according to claim 1, wherein said electrically conductive layer has:
ground contact connecting areas with sides; and
slots bounding said ground contact connecting areas and disposed at a side of each of said ground contact connecting areas.

17. The electronic component according to claim 5, wherein:
said contact connecting areas are solder contact connecting areas; and
solder stop resist areas are disposed on said waveguides and bound said solder contact connecting areas.

18. The electronic component according to claim 17, wherein:
said dielectric body has a central area and edge areas;
said edge areas are bent with respect to said central area; and
said solder contact connecting areas are disposed on said edge areas of said dielectric body.

19. The electronic component according to claim 1, wherein said dielectric body has a liquid crystal polymer material.

20. The electronic component according to claim 1, wherein said dielectric body is of a liquid crystal polymer material.

21. The electronic component according to claim 1, wherein said dielectric body is an injection molded body.

22. A method of producing an electronic component, which comprises:
forming a dielectric body having a central area, edge areas bent with respect to the central area, an upper side with a closed, electrically conductive covering layer, and an underside disposed opposite the upper side;
providing external flat conductor waveguides having a given characteristic impedance on the underside of the dielectric body;
providing a conductive layer on the underside of the dielectric body; and
arranging the conductive layer to be coplanar with and surround the waveguides.

23. The method according to claim 22, which further comprises:
forming the dielectric body with electrically conductive edge coatings; and
connecting the conductive layer to the covering layer through the edge coatings.

24. The method according to claim 22, which further comprises connecting the conductive layer and the covering layer to a common ground potential.

25. The method according to claim 22, wherein the conductive layer is a selected one of the group consisting of copper and copper alloy.

26. The method according to claim 25, which further comprises:
providing the conductive layer and the waveguides with contact connecting areas; and
providing a solderable coating on the contact connecting areas.

27. The method according to claim 22, which further comprises:
forming each of the waveguides with a soldering end and a bonding end; and
forming the dielectric body with a material thickness gradually increasing from the bonding end of each of the waveguides to the soldering end of each of the waveguides.

28. The method according to claim 22, which further comprises:
forming each of the waveguides having a soldering end and a bonding end and a width gradually increasing from the bonding end to the soldering end;
providing a semiconductor chip having an active upper side with a contact area grid of contact areas thereon;
providing a ceramic substrate having a contact connecting area grid of contact connecting area;
providing a system printed circuit board having a contact connecting area grid of contact connecting areas; and
the waveguides and the width corresponding to the area grid of one of the semiconductor chip, the ceramic substrate, and the system printed circuit board.

29. The method according to claim 22, which further comprises:
forming each of the waveguides with a soldering end and a bonding end; and
providing a spacing between the waveguides and the conductive layer increasing gradually from the bonding end to the soldering end of the waveguides.

30. The method according to claim 22, which further comprises:
forming the central area with rectangular shape having sided; and
projecting each of the bent edge areas from each of the sides of the central area.

31. The method according to claim 22, which further comprises providing a semiconductor chip disposed at the central area.

32. The method according to claim 22, which further comprises adapting the central area to support a semiconductor chip.

33. The method according to claim 28, which further comprises:
providing the semiconductor chip with contact beads; and
disposing at least one of the contact areas and the contact beads on bonding ends of the waveguides using a flip-chip technique.

34. The method according to claim 28, which further comprises connecting the contact areas of the semiconductor chip through bonding connections to the bonding ends of the waveguides.

35. The method according to claim 22, which further comprises:
forming the covering layer with a central area; and
disposing a heat sink in the central area.

36. The method according to claim 34, which further comprises:
forming the dielectric body with a central area and an opening in the central area;
providing a heat sink bridging the opening on the upper side of the dielectric body;
providing the semiconductor chip with a rear side disposed in the opening with the rear side on the heat sink;
providing bonding connections from the contact areas on the upper side of the semiconductor chip to the bonding ends of the waveguides; and
embedding the semiconductor chip and the bonding connections in a plastic compound.

37. The method according to claim 22, which further comprises:
providing the electrically conductive layer having ground contact connecting areas with sides; and
providing slots bounding the ground contact connecting areas and disposed at a side of each of the ground contact connecting areas.

38. The method according to claim 26, which further comprises:
forming the contact connecting areas as solder contact connecting areas; and
disposing solder stop resist areas on the waveguides and bounding the solder contact connecting areas.

39. The method according to claim 38, which further comprises:
forming the dielectric body with a central area and edge areas;
bending the edge areas with respect to the central area; and
disposing the solder contact connecting areas on the edge areas of the dielectric body.

40. The method according to claim 22, wherein the dielectric body includes a liquid crystal polymer material.

41. The method according to claim 22, wherein the dielectric body is a liquid crystal polymer material.

42. The method according to claim 22, wherein the dielectric body is an injection molded body.

* * * * *

UNITED STATES PATENT AND TRADEMARK OFFICE
CERTIFICATE OF CORRECTION

PATENT NO. : 6,825,549 B2
DATED : November 30, 2004
INVENTOR(S) : Gerold Gründler It is certified that error appears in the above-identified patent and that said Letters Patent is hereby corrected as shown below:

<u>Column 13,</u>
Line 22, should read -- contact connecting areas; --

<u>Column 15,</u>
Line 17, should read -- area grid of contact connecting areas; --
Line 17, should read -- sides; and --

Signed and Sealed this

Twenty-second Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,825,549 B2
DATED : November 30, 2004
INVENTOR(S) : Gerold Gründler It is certified that error appears in the above-identified patent and that said Letters Patent is hereby corrected as shown below:

Column 13,
Line 22, should read as follows -- contact connecting areas; --

Column 15,
Line 17, should read as follows -- area grid of contact connecting areas; --
Line 17, should read as follows -- sides; and --

Signed and Sealed this

Twenty-first Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,825,549 B2
DATED : November 30, 2004
INVENTOR(S) : Gerold Gründler It is certified that error appears in the above-identified patent and that said Letters Patent is hereby corrected as shown below:

Column 13,
Line 23, should read as follows -- contact connecting areas; --

Column 15,
Line 17, should read as follows -- area grid of contact connecting areas; --
Line 33, should read as follows -- sides; and --

This certificate supersedes Certificate of Correction issued June 21, 2005.

Signed and Sealed this

Twenty-sixth Day of July, 2005

JON W. DUDAS
*Director of the United States Patent and Trademark Office*